(12) United States Patent
Nozawa et al.

(10) Patent No.: US 7,754,995 B2
(45) Date of Patent: Jul. 13, 2010

(54) PLASMA PROCESSING APPARATUS AND PLASMA PROCESSING METHOD

(75) Inventors: Toshihisa Nozawa, Hyogo (JP); Masaru Sasaki, Hyogo (JP); Masaji Inoue, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/535,856

(22) PCT Filed: Nov. 20, 2003

(86) PCT No.: PCT/JP03/14850

§ 371 (c)(1),
(2), (4) Date: May 20, 2005

(87) PCT Pub. No.: WO2004/047158

PCT Pub. Date: Jun. 3, 2004

(65) Prior Publication Data

US 2006/0108331 A1    May 25, 2006

(30) Foreign Application Priority Data

Nov. 20, 2002  (JP) .............................. 2002-336837

(51) Int. Cl.
*B23K 10/00* (2006.01)
*C23C 8/00* (2006.01)

(52) U.S. Cl. ..................... 219/121.36; 219/121.59; 148/240; 148/284

(58) Field of Classification Search ............ 219/121.36, 219/121.38, 121.4, 121.41, 121.43, 121.59; 156/345.43, 345.48; 148/240, 284
See application file for complete search history.

(56) References Cited

U.S. PATENT DOCUMENTS

| | | | | | |
|---|---|---|---|---|---|
| 4,491,496 | A | * | 1/1985 | Laporte et al. | 156/345.47 |
| 5,366,585 | A | * | 11/1994 | Robertson et al. | 216/67 |
| 5,866,213 | A | * | 2/1999 | Foster et al. | 427/573 |
| 5,895,586 | A | * | 4/1999 | Kaji et al. | 219/121.43 |
| 5,916,378 | A | * | 6/1999 | Bailey et al. | 148/243 |
| 6,124,833 | A | * | 9/2000 | Bialkowski et al. | 343/770 |

(Continued)

FOREIGN PATENT DOCUMENTS

EP       725160 A1 *  8/1996

(Continued)

OTHER PUBLICATIONS

Donald M. Mattox, The Foundations of Vacuum Coating Technology, 2003, Noyes Publications/William Andrew Publishing, Glossary of Terms and Acronyms for Vacuum Coating Technology, pp. 10, 12.*

*Primary Examiner*—Stephen J Ralis
(74) *Attorney, Agent, or Firm*—Oblon, Spivak, McClelland, Maier & Neustadt, L.L.P.

(57) ABSTRACT

A plasma processing apparatus comprising at least a plasma processing chamber for plasma-processing an object; object-holding means for disposing the object in the plasma processing chamber; and plasma-generating means for generating a plasma in the plasma processing chamber. The inner wall of the plasma processing chamber is at least partially covered with an oxide film based on a pre-treating plasma. A plasma processing apparatus and a plasma processing method effectively prevent the spluttering and the etching of the inner wall of the plasma processing chamber while suppressing contamination to the object.

6 Claims, 7 Drawing Sheets

U.S. PATENT DOCUMENTS

| | | | | |
|---|---|---|---|---|
| 6,158,383 | A * | 12/2000 | Watanabe et al. | 118/723 AN |
| 6,164,295 | A | 12/2000 | Ui et al. | |
| 6,206,973 | B1 * | 3/2001 | Bailey et al. | 118/718 |
| 6,208,015 | B1 * | 3/2001 | Bandyopadhyay et al. | 257/635 |
| 6,242,054 | B1 * | 6/2001 | Baalmann et al. | 427/489 |
| 6,291,366 | B1 * | 9/2001 | Sano et al. | 438/773 |
| 6,423,175 | B1 * | 7/2002 | Huang et al. | 156/345.51 |
| 6,470,824 | B2 * | 10/2002 | Kawakami et al. | 118/723 AN |
| 6,612,898 | B1 * | 9/2003 | Ohmi et al. | 148/280 |
| 6,843,858 | B2 * | 1/2005 | Rossman | 134/30 |
| 2002/0086118 | A1 * | 7/2002 | Chang et al. | 427/447 |
| 2002/0119674 | A1 * | 8/2002 | Thakur | 438/758 |

FOREIGN PATENT DOCUMENTS

| | | |
|---|---|---|
| JP | 2-21598 | 1/1990 |
| JP | 3-75373 | 3/1991 |
| JP | 5-62914 | 3/1993 |
| JP | 7-169700 | 7/1995 |
| JP | 8-190994 | 7/1996 |
| JP | 9-217166 | 8/1997 |
| JP | 10-50685 | 2/1998 |
| JP | 2000-200786 | 7/2000 |
| WO | WO 9922878 A2 * | 5/1999 |

* cited by examiner

PLASMA PROCESSING APPARATUS AND PLASMA PROCESSING METHOD

TECHNICAL FIELD

The present invention relates to a plasma processing apparatus that can be favorably used for putting an object to be treated (or an object to be processed) to a variety of treatments with plasma for producing electronic devices, and to a plasma processing method.

BACKGROUND ART

The plasma processing apparatus of the present invention can be extensively used for the treatment with a plasma, such as producing semiconductors or semiconductor devices and electronic device materials like liquid crystal devices. Here, however, the description deals with the background art for semiconductor devices.

In the step of producing semiconductor devices, in general, a base member (wafer) for a semiconductor device that is to be treated is subjected to various treatments such as oxidizing treatment, CVD (chemical vapor deposition) treatment, etching treatment, sputtering treatment and the like treatments.

So far, a plasma processing apparatus has in many cases been used for executing a variety of treatments. This is because use of the plasma processing apparatus offers an advantage of a treatment at a low temperature.

So far, a plasma processing chamber for plasma-processing the object has been constituted, usually, by using metallic wall. In this case, ions contained in the plasma generated in the plasma processing chamber impinge on the inner, wall of the plasma processing chamber, whereby the metal constituting the inner wall is sputtered and/or etched often causing the object to be contaminated.

To suppress the sputtering and/or etching, it has heretofore been attempted to treat the inner wall of the plasma processing chamber with Alumite (i.e., form an oxide film on the aluminum surfaces) or to form a ceramic coating on the inner wall.

The treatment with Alumite or the ceramic coating is effective in suppressing the sputtering and/or the etching due to the plasma. In the step of treating with Alumite or forming the ceramic coating, however, a considerable impurity tends to contaminated into the film. Once such impurity is contaminated, it becomes very difficult to clean the inner wall to a sufficient degree after coated with the film despite the inner wall of the plasma processing chamber is subjected to cleaning (by using, for example, hydrofluoric acid).

When the object is treated with the plasma in the plasma processing chamber that has not been cleaned to a sufficient degree, the impurity is physically discharged by sputtering from the inner wall of the plasma processing chamber due to the irradiation with irons produced by the plasma, and deposit on the object giving rise to the occurrence of various problems such as the so-called metal contamination.

The metal contamination tends to become more serious particularly in recent years with an increase in the degree of integration of circuits in the semiconductor devices.

DISCLOSURE OF THE INVENTION

It is an object of the present invention to provide a plasma processing apparatus and a plasma processing method eliminating the defects inherent in the prior technology.

Another object of the present invention is to provide a plasma processing apparatus and a plasma processing method effectively preventing the sputtering and the etching of the inner wall of the plasma processing chamber while suppressing the contamination to the object.

The inventors have conducted a keen study and have discovered that the above object can be achieved very effectively if an oxide film is formed on the inner wall of the plasma processing chamber (and/or on the part constituting the inner wall) by utilizing the plasma processing itself instead of separately executing the Alumite treatment or the ceramic coating that has heretofore been effected.

A plasma processing apparatus of the present invention is based on the above discovery and, if described more closely, comprises at least a plasma processing chamber for plasma-processing an object; object-holding means for disposing the object in the plasma processing chamber; and plasma-generating means for generating a plasma in the plasma processing chamber; wherein the inner wall of the plasma processing chamber is at least partially covered with an oxide film based on a pre-treating plasma.

According to the present invention, further, there is provided a plasma processing apparatus comprising at least a plasma processing chamber for plasma-processing an object; object-holding means for disposing the object in the plasma processing chamber; and plasma-generating means for generating a plasma in the plasma processing chamber; wherein when the object that serves as a reference in the plasma processing chamber is treated with a plasma based on an oxygen-containing gas, the total number of atoms of Al, Cu, Na and Fe in the object after the treatment is not greater than $2 \times 10^{10}$.

According to the present invention, further, there is provided a plasma processing method by using a plasma processing apparatus comprising at least a plasma processing chamber for plasma-processing an object; object-holding means for disposing the object in the plasma processing chamber; and plasma-generating means for generating a plasma in the plasma processing chamber; wherein a pre-treating plasma is generated in the plasma processing chamber based on an oxygen-containing gas to form an oxide film on at least a portion of the inner wall of the plasma processing chamber.

In the invention having the above-mentioned constitution, the contaminating metals themselves present in the inner-wall of the plasma processing chamber are not only removed by sputtering based on the plasma processing for cleaning but also an oxide film is formed maintaining a predetermined thickness (e.g., about 10 nm to 100 nm) on the surfaces of the inner wall of the plasma processing chamber making it possible to effectively suppress the occurrence of contamination in the subsequent treatment with the plasma.

Further, the oxide film (formed by the treatment with the plasma) formed on the inner surfaces of the plasma processing chamber by the treatment with the plasma for cleaning exhibits a sufficiently large resistance against the irradiation with ions.

BEST MODE FOR CARRYING OUT THE INVENTION

Figure 1:
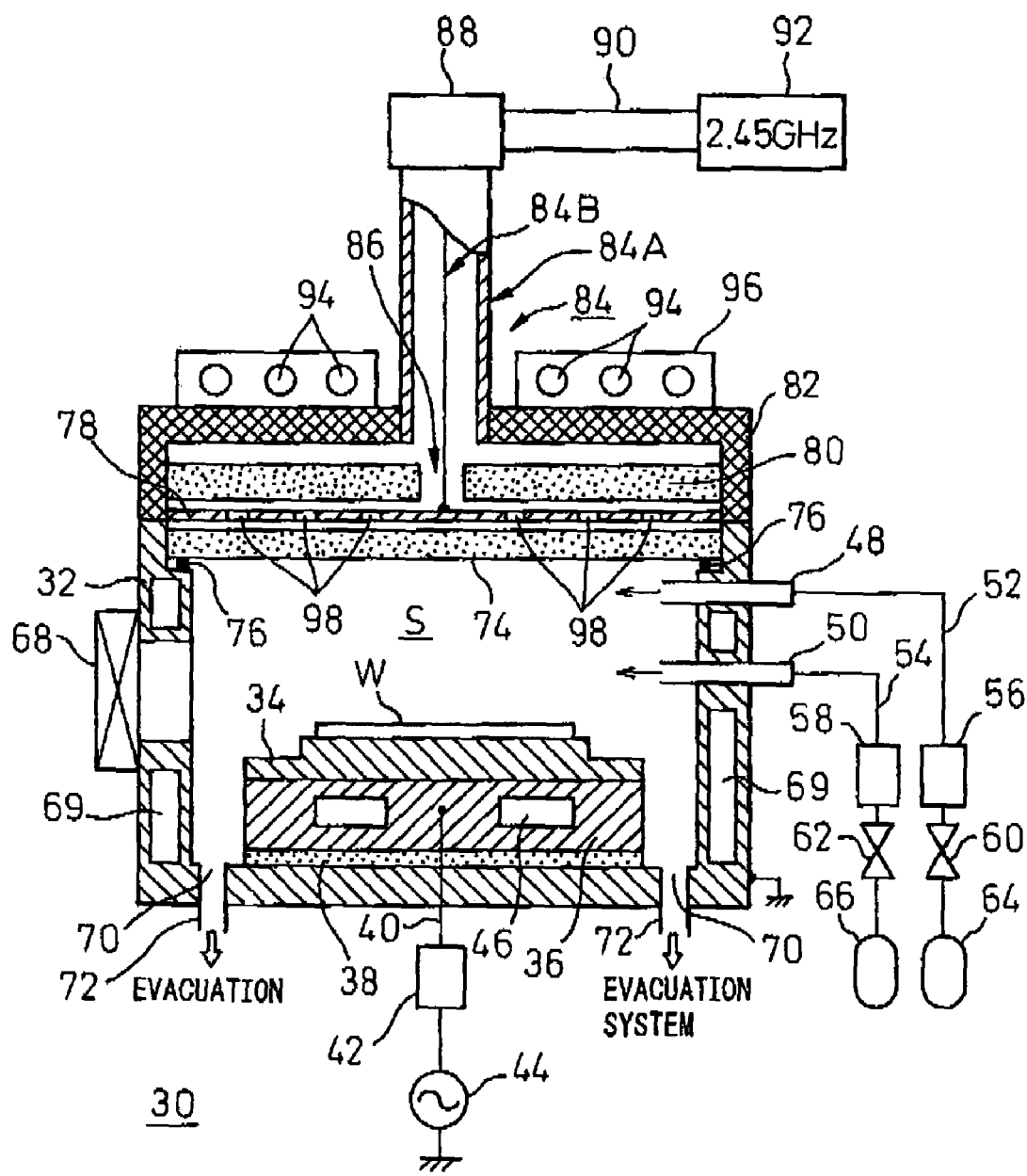
FIG. 1 is a schematic sectional view illustrating a preferred embodiment of a plasma processing apparatus of the present invention.

The invention will be described more concretely with reference, as desired, to the drawings. In the following description, "part" and "%" representing quantitative ratios are all by mass unless stated otherwise.

(Plasma Processing Apparatus)

A plasma processing apparatus of the present invention comprises at least a plasma processing chamber for plasma-processing an object; object-holding means for disposing the object at a predetermined position in the plasma processing chamber; and plasma-generating means for generating a plasma in the plasma processing chamber. In the plasma processing apparatus, the inner wall of the plasma processing chamber is at least partially covered with an oxide film based on a pre-treating plasma.

In a state where the plasma processing apparatus is assembled according to the present invention, it suffices if the inner wall of the apparatus is at least partially covered with the oxide film based on the pre-treating plasma. Namely, the oxide film may be formed on the inner wall after the plasma processing apparatus has been assembled, may be formed on the part having portion constituting the inner wall or, as desired, may be one which is formed before and after the assembling.

(Oxide Film Based on the Pre-Treating Plasma)

From the standpoint of preventing the object from being contaminated, it is desired in the present invention that not less than 50% of the total area of the inner wall of the plasma processing chamber is covered with an oxide film having a thickness of at least 10 nm. It is, further, desired that the ratio of the area covered with the oxide film having a thickness of at least 20 nm is not smaller than 60% and, particularly, not smaller than 80%. It is desired that the oxide film has an average thickness of 20 nm and, more preferably, 30 nm.

A ratio ($R_{a2}/R_{a1}$) of surface roughness $R_{a2}$ after the oxide film is formed to surface roughness $R_{a1}$ before the oxide film is formed, is preferably not greater than 2.

In the present invention, the thickness of the oxide film, the average thickness thereof and "the ratio of the area covered with the oxide film having a thickness of at least 10 nm", can be preferably measured by the measuring methods described below.

(Degree of Metal Contamination)

From the standpoint of preventing the object from being contaminated in the present invention, it is desired that when the object that serves as a reference of degree of contamination is treated with a plasma based on the oxygen-containing gas in the plasma processing chamber, the total number of atoms of Al, Cu, Na and Fe (hereinafter, these four kinds of metal elements as a whole are often referred to as "contaminating metals") in the object after the treatment is not larger than $2\times10^{10}$. It is particularly desired that the total number of atoms of Al, Cu, Na and Fe is not larger than $1\times10^{10}$. This is because when deposited on the object or taken in therein, these four kinds of contaminating metals adversely affect the characteristics of the object that is treated (e.g., characteristics of a semiconductor device) to a striking degree.

As will be described later in embodiments and examples, a silicon wafer which is a standard sample (sample wafer, diameter of 20 cm) is disposed in the plasma processing apparatus that measures the total number of atoms of contaminating metals, and is treated with a plasma to measure the total number of atoms of contaminating metals in the wafer after treated with the plasma.

(Method of Pre-Treatment with a Plasma)

Next, described below is a method of obtaining the plasma processing apparatus that is oxidized as described above.

That is, the oxidizing method uses the plasma processing apparatus comprising at least a plasma processing chamber for plasma-processing an object; object-holding means for disposing the object at a predetermined position in the plasma processing chamber; and antenna means for guiding the microwaves into the plasma processing chamber. In the present invention, a plasma based on an oxygen-containing gas is generated in the plasma processing chamber in the plasma processing apparatus to form an oxide film on the inner wall of the plasma processing chamber.

In forming the oxide film, as desired, other objects (e.g., part of the plasma processing apparatus or constituent elements thereof) may be disposed in the plasma processing chamber to form an oxide film on the surfaces of the part.

(Oxygen-Containing Gas)

An oxygen-containing gas can be preferably used for the pre-treatment with the plasma. In the "oxygen-containing gas", the gas by itself (a single gas) may contain at least oxygen, or at least one composition constituting the gas (when the gas is a mixture) may at least be oxygen. Examples of the "oxygen-containing gas" are as described below.

<Examples of Oxygen-Containing Gas>

$O_2$, $N_2O$, $CO_2$, $H_2O$, $H_2O_2$ (Preferred Oxygen-Containing Gas Conditions)

In the present invention, the following gases may particularly preferably be used from the standpoint of cost and safety.

(1) Oxygen+hydrogen (2) Water-containing gas (Other Pre-Treating Plasma Conditions)

In the present invention, the following pre-treating plasma conditions may particularly preferably be used. Namely, the "pre-treating plasma" conditions is different from the following ordinary plasma conditions with respect to the rate of treatment.

| (1) Pressure | 3 to 100 Pa |
| (2) Temperature | 50° C. |
| (3) Treating time | not less than 20 minutes |
| (4) Plasma power | 2000 W |

(Ordinary Plasma Conditions)

In the present invention, it is allowable to use the plasma processing conditions for the ordinary object (e.g., substrate for electronic devices, such as semiconductor wafer, etc.).

| | |
|---|---|
| (1) Pressure | 67 to 200 Pa |
| (2) Temperature | 400° C. |
| (3) Treating time | 1 to 10 minutes |
| (4) Plasma power | 7000 W |

(Monitoring the Oxidation of the Plasma processing Chamber)

In the present invention, the degree of oxidation in the plasma processing chamber by the pre-treating plasma can be measured by, for example, using a standard sample wafer (or wafer for monitoring) as the wafer W of FIG. 1 described above and by monitoring the degree of oxidation of the sample wafer by measuring the film thickness.

(Combination with the Wet Cleaning)

Coating the interior of the plasma processing chamber with the oxide film by the pre-treating plasma is effective by itself, but the effect is further increased if it is combined with wet-cleaning the plasma processing chamber in advance.

(Wet Cleaning)

In the present invention as described above, it is desired to effect the pre-treatment with the plasma after the wet-cleaning of plasma processing chamber. From the standpoint of removing heavy metals, it is desired that the wet cleaning in this case includes the cleaning with an acid.

(Object to be Treated)

There is no particular limitation on the kind, material, shape, size and production method of the object so far as forming an oxide film thereon is effective. The object may be, for example, the sample wafer described above, elements or part constituting the plasma processing apparatus, or various substrates (substrates for various semiconductor devices, such as silicon, etc.) for electronic devices.

(Plasma Processing Chamber)

There is no particular limitation on the kind, material, shape, size and production method of the plasma processing chamber so far as forming an oxide film thereon is effective. The plasma processing chamber may be made of a metal (e.g., aluminum, SuS, Si, etc.) or any other material (e.g., ceramic).

(Object-Holding Means)

There is no particular limitation on the kind, material, shape, size and production method of the object-holding means so far as it is capable of holding the object for a predetermined period of time. There can be preferably used any known object-holding means, such as chuck, electrostatic holding means or the like.

(Plasma-Generating Means)

Any plasma-generating means can be used without limitation so far as a predetermined plasma (e.g., pre-treating plasma, plasma for treating other objects) can be generated in the plasma processing chamber.

Among them, it is desired that the plasma-generating means is antenna means for guiding the microwaves into the treating chamber from the standpoint of accomplishing a high density. From the standpoint of homogeneity of plasma, further, it is desired that the antenna means is a plane antenna (RLSA) having a plurality of slots.

(Embodiment of the Plasma Processing Apparatus)

FIG. 1 is a schematic sectional view illustrating an embodiment of a plasma processing apparatus according to the present invention.

Referring to FIG. 1, this embodiment deals with a case where the plasma processing apparatus is applied to the plasma CVD (chemical vapor deposition) treatment. In the embodiment of FIG. 1, a plane antenna member is used as the antenna member.

As shown in FIG. 1, a plasma processing apparatus 30 has side wall and a bottom portion which is made of a conducting material such as aluminum, has a plasma processing chamber 32 which as a whole is formed in a cylindrical shape, and its interior is constituted as a closed treating space S.

The plasma processing chamber 32 contains a pedestal 34 for mounting an object (e.g., semiconductor wafer W) on the upper surface thereof. The pedestal 34 is made of, for example, Alumite-treated aluminum formed in nearly a cylindrical shape that is flatly protruding, and is supported at its lower portion by a support 36 made of aluminum and is formed in a cylindrical shape. The support 36 is placed on the bottom portion of the plasma processing chamber 32 via an insulating member 38.

On the upper surface of the pedestal 34, there is provided an electrostatic chuck or a cramping mechanism (not shown) for holding the wafer. The pedestal 34 is further connected to a matching box 42 and to a biasing high-frequency power source (e.g., 13.56 MHz) 44 via a feeder wire 40. In the case of the CVD, the biasing high-frequency power source 44 may not be provided.

The support 36 for supporting the pedestal 34 is provided with a cooling jacket 46 for flowing the cooling water for cooling the wafer W when it is being treated with the plasma. As desired, further, a heater for heating may be provided in the pedestal 34.

The side wall of the plasma processing chamber 32 is provided with gas-feeding means such as plasma gas-feeding nozzles 48 made of quartz pipes for feeding a plasma gas like argon gas into the container, and treating gas-feeding nozzles 50 made of quartz pipes for introducing a treating gas like a deposition gas. These nozzles 48 and 50 are connected to a plasma gas source 64 and to a treating gas source 66 through gas-feeding passages 52, 54, mass flow controllers 56, 58, and switching valves 60, 62. As the deposition gas which is the treating gas, there can be used an $SiH_4$ gas, an $O_2$ gas or an $N_2$ gas.

On the outer side of the side wall of the plasma processing chamber 32, there are provided a gate valve 68 that opens and closes at the time of carrying the wafer W into, and from, the interior of the plasma processing chamber 32, and a cooling jacket 69 for cooling the side wall. Exhaust ports 70 are formed in the bottom portion of the container. Exhaust passages 72 are connected to the exhaust ports 70 via a vacuum pump that is not shown to evacuate, as desired, the interior of the plasma processing chamber 32 down to a predetermined pressure. The ceiling portion of the plasma processing chamber 32 is opened, and on where an insulating plate 74 (having a thickness of; for example, about 20 mm) that is made of a ceramic material such as AlN and that permits the transmission of microwaves is air-tightly provided via a sealing member 76 such as an O-ring.

On the upper surface of the insulating plate 74, there are provided a disk-like plane antenna member 78 and a wave-retarding member 80 having a high dielectric constant. Concretely, the plane antenna member 78 is constituted as a bottom plate of a waveguide box 82 which is a hollow cylindrical container formed integrally with the plasma processing chamber 32, and is facing the pedestal 34 in the plasma processing chamber 32. The waveguide box 82 and the plasma processing chamber 32 are both grounded, and an outer conductor 84A of a coaxial waveguide 84 is connected to the center on the upper part of the waveguide box 82. An inner conductor 84B inside therein is connected to the central portion of the plane antenna member 78 through a central hole 86 in the wave-retarding member 80.

The coaxial waveguide 84 is connected to a microwave generator 92 of, for example, 2.45 GHz via a mode converter 88 and a waveguide 90, and propagates the microwaves to the plane antenna member 78. The frequency is not limited to 2.45 GHz only, and any other frequency may be used, such as 8.35 GHz.

As the waveguide 90, there can be used a waveguide or a coaxial waveguide having a circular shape or a rectangular shape; in cross section. The upper part of the waveguide box 82 is provided with a ceiling-cooling jacket 96 forming cooling water passages 94 for flowing the cooling water to cool the wave-retarding member 80.

The wave-retarding member 80 having a high dielectric constant is provided in the waveguide box 82 on the upper surface of the plane antenna member 78 to shorten the wavelength of microwaves in the tube relying on the effect of shortening the wavelength. As the wave-retarding member 80, there can be used, for example, aluminum nitride.

To deal with the wafer W of a size of 8 inches, the plane antenna member 78 is made of a disk made of an electrically conducting material, such as a copper plate or an aluminum plate of which the surface is plated with silver and having a diameter of 300 to 400 mm and a thickness of one to several millimeters (e.g., 5 mm), the disk having a number of microwave radiation holes 98 which are, for example, circular through holes being arranged nearly uniformly in the antenna member 78. There is no particular limitation on the arrangement of microwave radiation holes 98; i.e., the microwave radiation holes 98 may be arranged in a concentric circular shape, in a spiral shape or in a radial shape. Further, the shape of the microwave radiation holes 98 is not limited to the circular shape but may be, for example, a slot like an elongated groove. Further, the radiation holes of the shape of the slot may be arranged in "╱╲" configuration.

Described below is a method of treatment carried out by using the plasma processing apparatus constituted as described above.

First, a semiconductor wafer W is contained in the plasma processing chamber 32 by using a transfer arm (not shown) via a gate valve 68. Then, a lifter pin (not shown) is moved up and down to place the wafer W on the placing surface which is the upper surface of the pedestal 34. The interior of the plasma processing chamber 32 is maintained in a predetermined processing pressure which is in a range of, for example, 0.01 to several Pa. Thereafter, an argon gas, for example, is fed while controlling the flow rate thereof from the plasma gas-feeding nozzles 48 and, at the same time, the deposition gas such as $SiH_4$, $O_2$ or $N_2$ is fed whole controlling the flow rate thereof from the treating gas feed nozzles 50. At the same time, the microwaves from the microwave generator 92 are fed to the plane antenna member 78 through the waveguide 90 and the coaxial waveguide 84. The microwaves of which the wavelength is shortened by the wave-retarding member 80 are introduced into the treating space S to generate a plasma and to carry out a predetermined treatment with the plasma, such as the film-forming treatment by the plasma CVD.

(Other Applications)

Though the above embodiment has dealt with the case where a film is formed on the semiconductor wafer W, the invention is in no way limited thereto only but can also be applied to any other plasma processing, such as etching with the plasma or ashing with the plasma. Further, the object to be treated is not limited to the semiconductor wafer W only but may be a glass substrate, an LCD (liquid crystal device) substrate and the like.

The invention will be described more concretely by way of Examples.

EXAMPLES

Example 1

Cleaning the Wafers

In the present invention, the sampling wafer, the monitoring wafer or the wafer to be put to the ordinary plasma processing, is, usually, subjected to cleaning in a manner as described below.

(1) Substrate.

The substrate was a P-type silicon substrate measuring 20 cm (8 inches) having a resistivity of 1 Ω-cm and a plane orientation (100).

(2) Cleaning Prior to Oxidizing the Gate.

A native oxide film and contaminating elements (metals, organic matters, particles) were removed by the RCA cleaning of a combination of APM (a mixed solution of ammonia: hydrogen peroxide:pure water=1:2:10, 60° C.), HFM (a mixed solution of hydrochloric acid:hydrogen peroxide solution:pure water=1:1:10, 60° C.) and DHF (a mixed solution of hydrofluoric acid pure water=1:100, 23° C.). The RCA cleaning consisted of APM, 10 minutes→rinse with pure water, 10 minutes→DHF, 3 minutes→rinse with pure water, 10 minutes→HPM, 10 minutes→rinse with pure water, 10 minutes→final rinse with pure water, 5 minutes, followed by IPA (isopropyl alcohol, 220° C.) drying for 15 minutes to dry the water on the wafer.

Example 2

Coating the Treatment Chamber with an Oxide Film by Using the Pre-Treating Plasma Referring to FIG. 1, the interior of the plasma processing chamber was coated with an oxide film by using a silicon wafer (sample wafer) W subjected to cleaning as in Example 1.

Example 3

Oxidation with Plasma by Using an Aluminum Member

Figure 2:
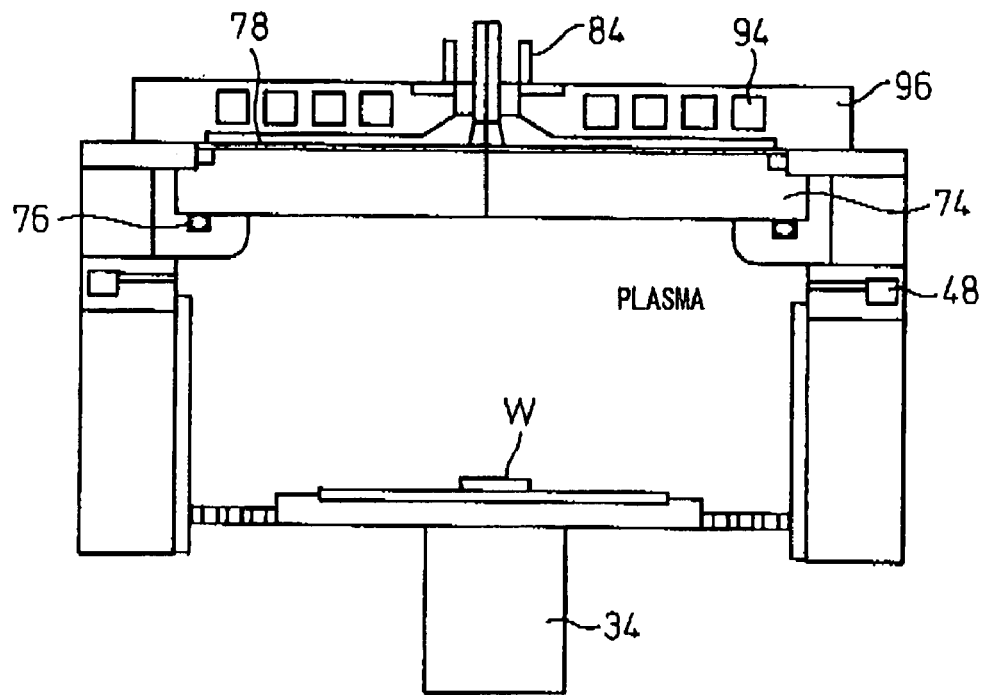
FIG. 2 is a schematic sectional view illustrating another embodiment of the plasma processing apparatus of the present invention.

By using a plasma processing apparatus shown in FIG. 2, the oxidizing treatment was conducted under the following plasma processing conditions to observe the oxidized state of the aluminum member forming the inner wall of the plasma processing chamber. The observed places were as shown in a schematic sectional view of FIG. 3.

Figure 4:
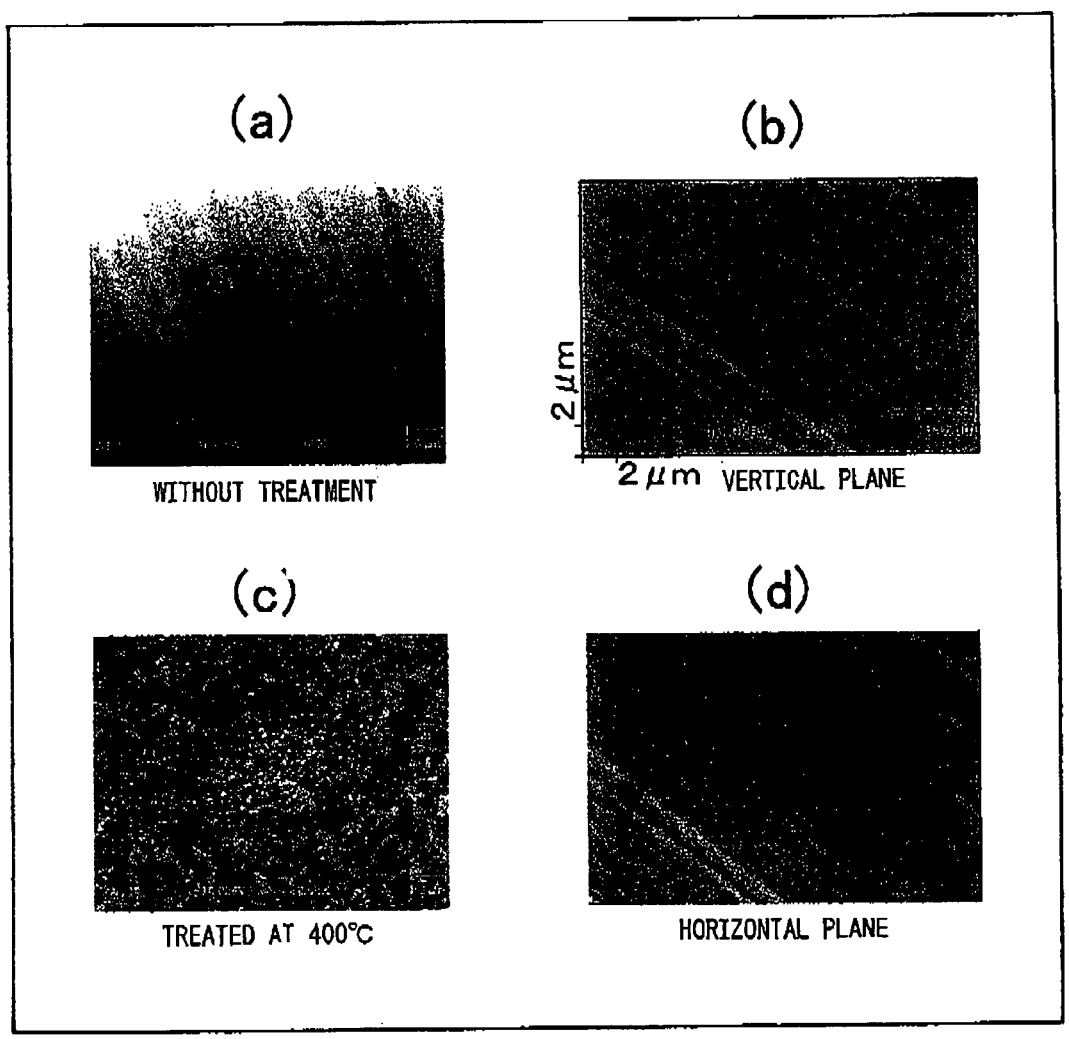
FIG. 4 shows photographs of the results of observing, by using a SEM, the oxide film on the inner wall (aluminum member) of the plasma processing apparatus of FIG. 2.
Figure 5:
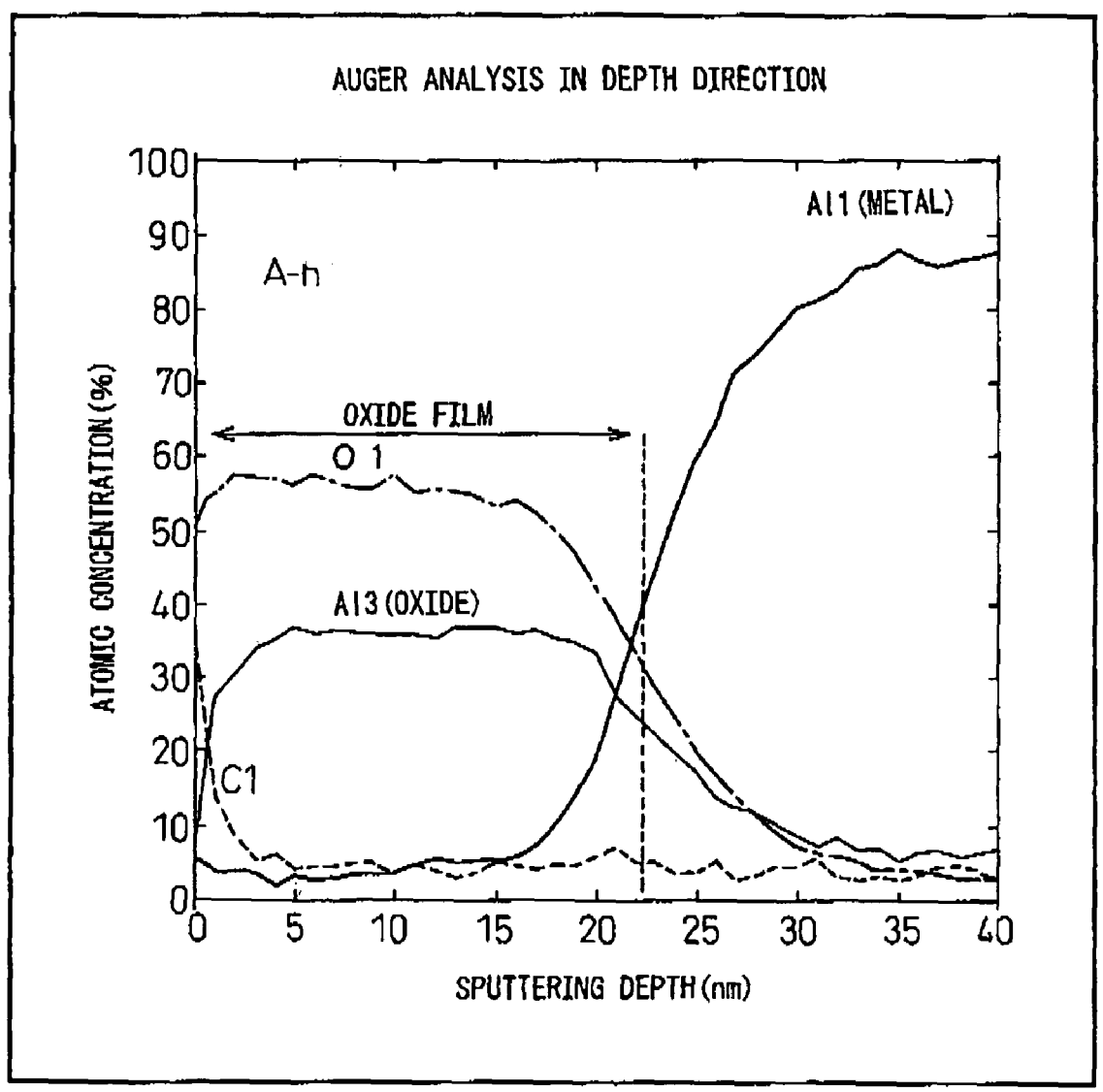
FIG. 5 is a diagram illustrating the results of Auger analysis on the inner wall (aluminum member) of the plasma processing apparatus of FIG. 2.

Plasma Processing Conditions
  Ar/O₂=1000/10 (sccm)
  Pressure: 6.7 Pa
  Plasma output: 2500 W
  Temperature: 400° C.
  Time; 60 minutes The results obtained by the above experiment are shown in Table 1, in the scanning electron microscopic (SEM) photographs of FIGS. 4(*a*) to 4(*d*) and in the Auger analytical results of FIG. 5.

Table 1
Thickness of Aluminum Oxide Film

| Place | Film Thickness |
|---|---|
| Vertical portion ①-1 | 9.3 nm |
| Vertical portion ①-2 | 10.7 nm |
| Horizontal portion ②-1 | 22.5 nm |
| Horizontal portion ②-2 | 17.2 nm |

Figure 3:
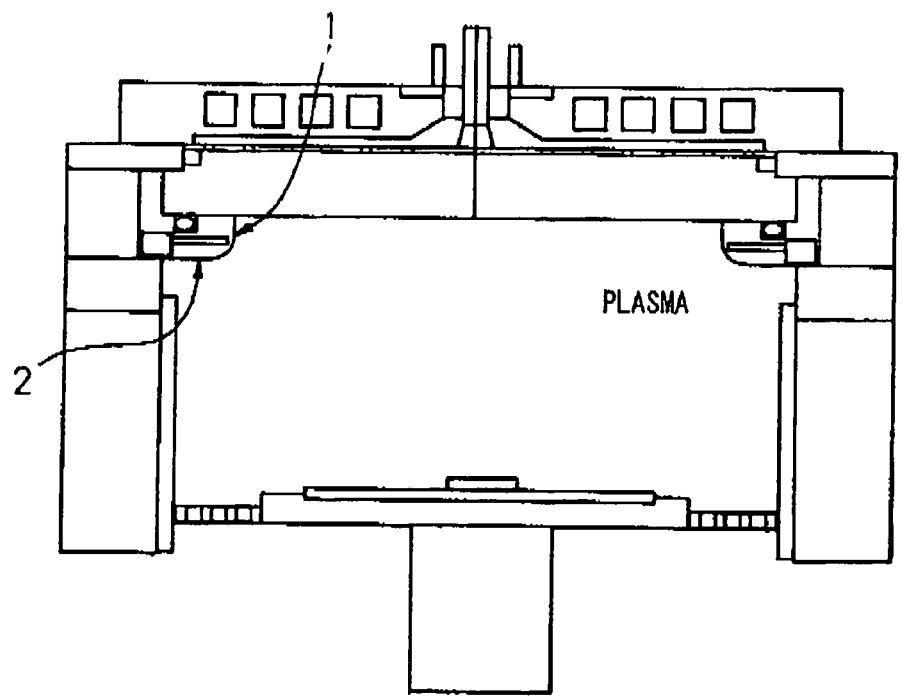
FIG. 3 is a schematic sectional view illustrating an observation position after an oxide film is formed on the inner wall of the plasma processing apparatus of FIG. 2.

The vertical portion (1) and the horizontal portion (2) in Table are corresponding to the portion illustrated in the schematic sectional view of FIG. 3.

Example 4

Oxidation with Plasma by Using Aluminum Test Pieces

Referring to FIG. 2, aluminum test pieces were oxidized under the following plasma processing conditions by using a plasma processing apparatus on which an oxide film has been formed in Example 2.

(1) Oxidizing Treatment.
  Ar/O₂=1000/10 (sccm)
  Pressure; 6.7 Pa
  Plasma output: 3500 W
  Temperature: 400° C.
  Time: 10 minutes×6 times=a total of 60 minutes (2) Nitriding Treatment.
  Ar/N₂=1000/40 (sccm)
  Pressure: 133 Pa
  Plasma output: 3500 W
  Temperature: 400° C.
  Time; 10 minutes×6 times=a total of 60 minutes (3) Oxidizing/Nitriding Treatment.
  The above oxidation and nitriding were executed each for 10 minutes three times (i.e., a total of 600 minutes in order of oxidation→nitriding).

TABLE 2

| Sample | Film thickness |
|---|---|
| Reference | 6.5 nm |
| Oxidation | 210.0 nm |
| Nitriding | 7.5 nm |
| Oxidation + nitriding | 200.0 nm |
| Treatment with ozone | 13.0 nm |

Figure 6:
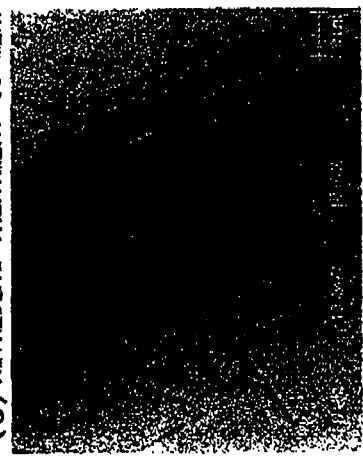
FIG. 6 shows photographs of the results of observing, by using a SEM, the oxide film/nitride film on aluminum test pieces disposed in the plasma processing apparatus of FIG. 2.
Figure 6:
Figure 6:
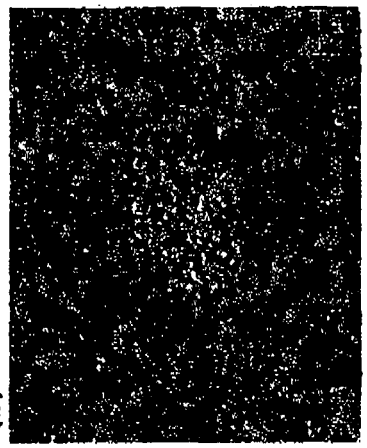
Figure 6:
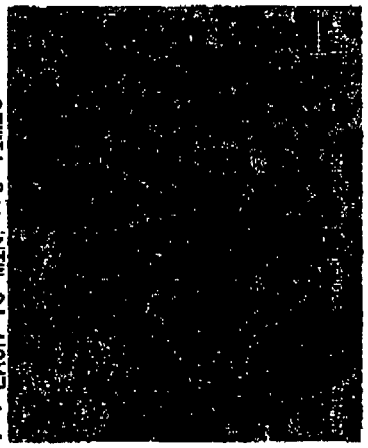
Figure 6:
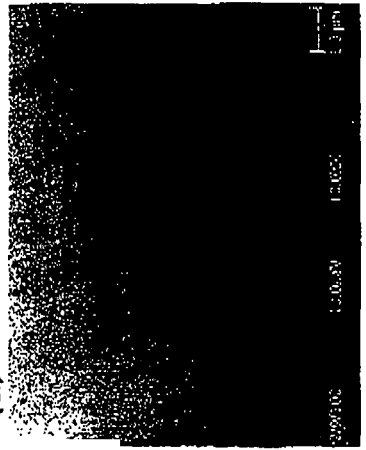

The treated samples obtained by the above experiment were observed by using the SEM as shown in the photographs of FIGS. 6(*a*) to 6(*e*).

As shown in Table 2 and FIG. 6, the sample was oxidized to a depth of 200 nm in one hour. However, almost no change was observed through the nitriding treatment. It was further confirmed that the surfaces of aluminum were modified by the oxidizing treatment accompanied, however, by an increase in the surface roughness after the treatment.

Example 5

Measurement of Metal Contamination

Referring to FIG. 2, a plasma was generated in the plasma processing chamber by a method described below by using a silicon wafer (sample wafer) W that has been subjected to cleaning as in Example 1, to measure the metal contamination on the sample wafer.

Figure 7:
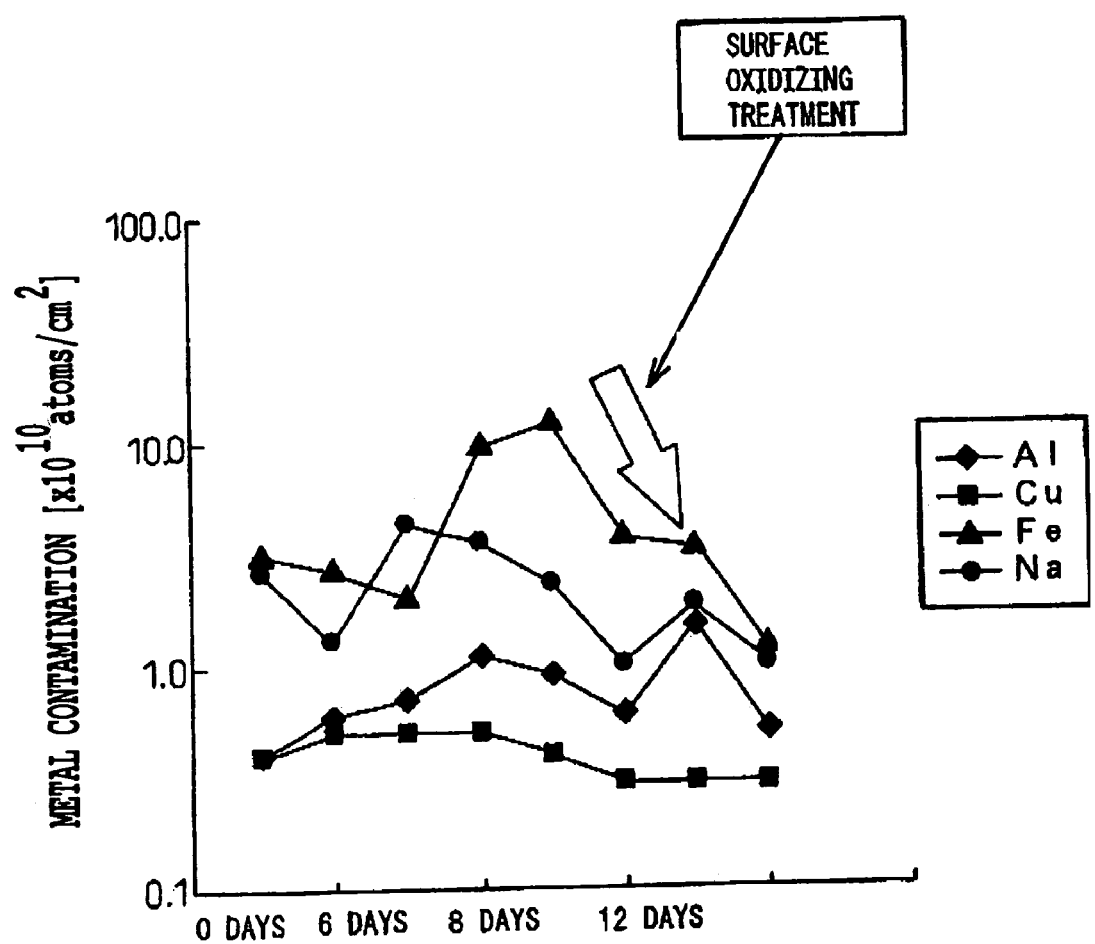
FIG. 7 is a graph illustrating the results of metal contamination measured in Example 5.
Figure 8:
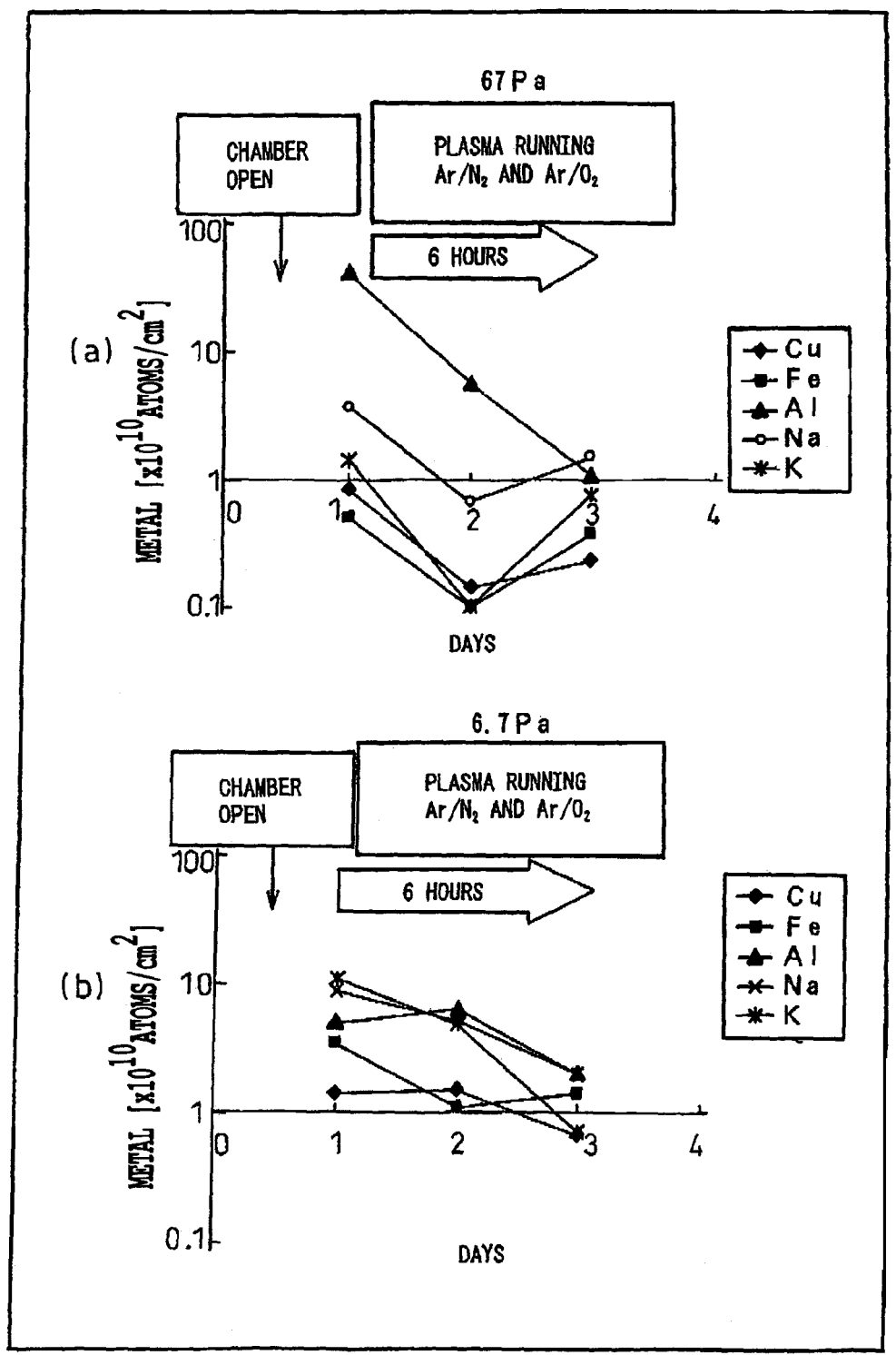
FIG. 8 is a graph illustrating the results of metal contamination measured in Example 5.

The measured results were as shown in the graphs of FIGS. 7 and 8.

INDUSTRIAL APPLICABILITY

According to the present invention as described above, there are provided a plasma processing apparatus and a plasma processing method effectively preventing the spluttering and the etching of the inner wall of the plasma processing chamber while suppressing the contamination to the object.

The invention claimed is:

1. A plasma processing apparatus, comprising:
a vacuum processing chamber for plasma-processing an object in a closed treating space;
an object-holding unit for disposing the object in the vacuum processing chamber;
a plasma-generating unit that generates a plasma in the processing chamber and forms an oxide film, the plasma-generating unit comprising an antenna including a plane antenna member including a plurality of slots for guiding microwaves into the processing chamber;
an evacuation unit that evacuates the processing chamber,
a gas supply unit that supplies gas into the processing chamber; and
the oxide film being formed on a surface of an inner wall comprising metal of the processing chamber, the oxide film being formed by introducing $O_2$ gas and $H_2$ containing gas from the gas supply unit and by generating, from the $O_2$ gas and $H_2$ gas, the plasma in the processing chamber, the plasma having a pressure of 3 to 100 Pa and a temperature of 50° C. to less than 400° C., said pressure and temperature being lower than a pressure and a temperature for plasma-processing the object,
wherein a ratio ($R_{a2}/R_{a1}$) of surface roughness $R_{a2}$ after the oxide film is formed to surface roughness $R_{a1}$ before the oxide film is formed, is not greater than 2.

2. A plasma processing apparatus according to claim 1, wherein the metal inner wall of the processing chamber is covered with ceramic or quartz.

3. A plasma processing method using a plasma processing apparatus including,
a vacuum processing chamber that plasma processes an object in a closed treating space, a surface of an inner wall of the chamber comprising metal;
an object-holding unit that disposes the object in the vacuum processing chamber;
a plasma-generating unit that generates a plasma in the processing chamber, the plasma-generating unit comprising an antenna including a plane antenna member including a plurality of slots for guiding microwaves into the vacuum processing chamber;

an evacuation unit that evacuates the processing chamber; and a gas supply unit that supplies gas into the vacuum processing chamber; the method comprising:

evacuating the vacuum processing chamber by the evacuation unit to reduce a pressure and a temperature lower than a pressure and a temperature used for plasma-processing the object, supplying $O_2$ gas and $H_2$ gas containing gas from the gas supply unit into the vacuum processing chamber;

generating, from the $O_2$ gas and $H_2$ gas, plasma as the gas plasma in the vacuum processing chamber under a pressure of 3 to 100 Pa and a temperature of 50° C. to less than 400° C., said pressure and temperature being lower than those for plasma-processing the object so as to form the oxide film on the surface of the inner wall of the vacuum processing chamber, wherein a ratio ($R_{a2}/R_{a1}$) of surface roughness $R_{a2}$ after the oxide film is formed to surface roughness $R_{a1}$ before the oxide film is formed, is not greater than 2, transferring the object on the object-holding unit in the vacuum chamber, supplying processing gas from the gas supply unit into the vacuum processing chamber, and generating the processing gas plasma by the plasma-generating unit to process the object.

4. A plasma processing method according to claim 3, wherein the metal inner wall of the processing chamber is covered with ceramic or quartz.

5. A plasma processing method according to claim 3, wherein the processing with the plasma is executed by using the oxygen-containing gas, after wet cleaning of the processing chamber.

6. A plasma processing method according to claim 5, wherein the wet cleaning includes cleaning with an acid.

* * * * *